(12) United States Patent
    Yoo

(10) Patent No.: US 8,842,255 B2
(45) Date of Patent: Sep. 23, 2014

(54) LIGHT SOURCE MODULE AND LIGHTING APPARATUS HAVING THE SAME

(71) Applicant: LG Innotek Co., Ltd., Seoul (KR)

(72) Inventor: Youngbong Yoo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 129 days.

(21) Appl. No.: 13/657,194

(22) Filed: Oct. 22, 2012

(65) Prior Publication Data

US 2013/0107169 A1    May 2, 2013

(30) Foreign Application Priority Data

Oct. 26, 2011    (KR) .................. 10-2011-0110059

(51) Int. Cl.
  *G02F 1/13*    (2006.01)
  *H01L 33/58*   (2010.01)
(52) U.S. Cl.
  CPC ...................................... *H01L 33/58* (2013.01)
  USPC ............ 349/200; 313/111; 313/507; 313/512

(58) Field of Classification Search
  USPC .......... 349/200, 201; 313/111, 501, 502, 507, 313/512
  See application file for complete search history.

(56) References Cited

U.S. PATENT DOCUMENTS

| 8,269,410 | B2* | 9/2012 | Kijima et al. ................. 313/501 |
| 8,269,411 | B2* | 9/2012 | Yu et al. ........................ 313/501 |
| 8,432,500 | B2* | 4/2013 | Van Bommel et al. ......... 349/22 |
| 8,664,847 | B2* | 3/2014 | Groetsch et al. .............. 313/502 |

\* cited by examiner

*Primary Examiner* — James Dudek
(74) *Attorney, Agent, or Firm* — Ked & Associates, LLP

(57) ABSTRACT

Disclosed are a light source module and a lighting apparatus having the same. The light source module includes a body having a cavity, a plurality of lead frames in the cavity, a light emitting chip on at least one of the lead frames, a polymer layer disposed on the body to refract light emitted from the light emitting chip, a first electrode layer disposed on the polymer layer to emit incident light, and a second electrode layer interposed between the polymer layer and the body to transmit the light emitted from the light emitting chip.

20 Claims, 10 Drawing Sheets

US 8,842,255 B2

LIGHT SOURCE MODULE AND LIGHTING APPARATUS HAVING THE SAME

The present application claims priority under 35 U.S.C. §119(a) of Korean Patent Application No. 10-2011-0110059 filed on Oct. 26, 2011, which is hereby incorporated by reference in its entirety.

BACKGROUND

The embodiment relates to a light source module and a lighting apparatus having the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response characteristics, and environmental-friendly requirement.

In this regard, various studies have been performed to substitute the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light source module having a novel structure.

The embodiment provides a light source module including an optical control unit disposed on a light emitting device to represent optical characteristics changed according to input voltage and a lighting apparatus having the same.

The embodiment provides a light source module capable of adjusting the light emission distribution of a light emitting device by providing a polymer layer having liquid crystal adjacent to the light emitting device and a lighting apparatus having the same.

According to the embodiment, there is provided a light source module including a body having a cavity, a plurality of lead frames in the cavity, a light emitting chip on at least one of the lead frames, a polymer layer disposed on the body to refract light emitted from the light emitting chip, a first electrode layer disposed on the polymer layer to emit incident light, and a second electrode layer interposed between the polymer layer and the body to transmit the light emitted from the light emitting chip.

According to the embodiment, there is provided a light source module including a body having a cavity, a plurality of lead frames in the cavity, a light emitting chip on at least one of the lead frames, a molding member in the cavity, a polymer layer disposed on the molding member to refract light emitted from the light emitting chip, a first electrode layer disposed on the polymer layer to emit incident light, and a second electrode layer interposed between the polymer layer and the body to transmit the light emitted from the light emitting chip. The polymer layer changes an orientation angle of the light emitted from the light emitting chip according to a difference between first and second driving voltages supplied to the first and second electrode layers.

According to the embodiment, there is provided a lighting apparatus including a plurality of light emitting devices including a body having a cavity, a plurality of lead frames in the cavity, and a light emitting chip on at least one of the lead frames, a plurality of control units disposed on the light emitting devices, respectively, to adjust an orientation angle of light emitted from a molding member according to an optical characteristic converted by a difference between supplied voltages, and a light guide plate on the control units. Each control unit includes a polymer layer disposed on the body and having liquid crystal, a first electrode layer disposed on the polymer layer and emitting incident light; and a second electrode layer interposed between the polymer layer and the body to transmit the light emitted from the light emitting chip.

DETAILED DESCRIPTION OF THE EMBODIMENTS

Figure 1:
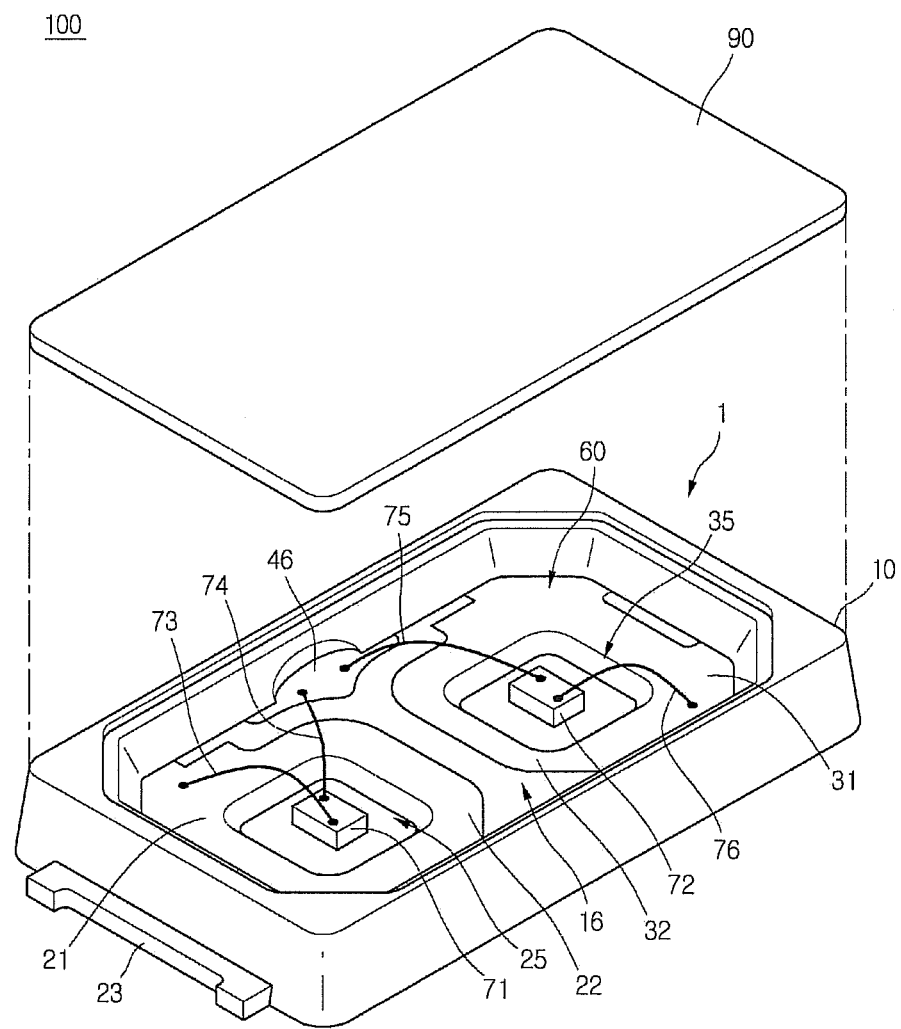
FIG. 1 is an exploded perspective view showing a light source module according to the first embodiment.

In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present. Such a position of the layer has been described with reference to the drawings. The size of elements shown in the drawings may be exaggerated for the purpose of explanation and the size of elements does not utterly reflect an actual size.

Hereinafter, embodiments will be clearly comprehended by those skilled in the art with reference to accompanying drawings and the description of the embodiments. The thickness and size of each layer shown in the drawings may be exaggerated, omitted or schematically drawn for the purpose of convenience or clarity. In addition, the size of elements does not utterly reflect an actual size. The same reference numbers will be assigned to the same elements throughout the drawings.

Hereinafter, a light source module according to the embodiment will be described with reference to accompanying drawings.

Figure 2:
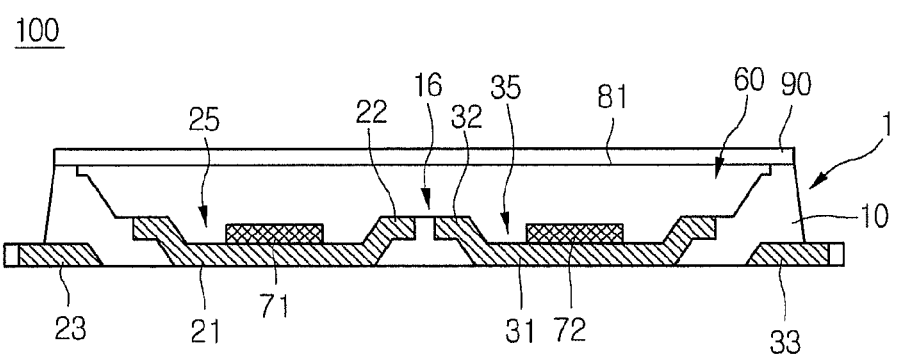
FIG. 2 is a side sectional view showing the light source module of FIG. 1.

FIG. 1 is an exploded perspective view showing a light source module according to the first embodiment, and FIG. 2 is an assembled side sectional view showing the light source module of FIG. 1.

Referring to FIGS. 1 and 2, a light source module 100 includes a light emitting device 1 and an optical control unit 90 disposed at a light exit side of the light emitting device 1 to represent optical characteristics changed according to input voltage. The light source module 100 may be a light emitting device including the light emitting device 1 having at least one LED chip.

The optical control unit 90 adjusts the angle at which input light is refracted. The optical control unit 90 may be adhered to a light exit surface of the light emitting device 1 to reduce the loss of incident light at the interfacial surface. In addition, the optical control unit 90 may adjust the intrinsic light orientation angle and light emission distribution of the light emitting device 1.

The light emitting device 1 includes a body 10 having a concave part 60, a first lead frame 21 having a first cavity 25, a second lead frame 31 having a second cavity 35, a connection frame 46, light emitting chips 71 and 72, wires 73 to 76, and a molding member 81. The first and second cavities 25 and 35 are provided at a lower region of the concave part 60.

The body 10 may include a transmissive material or a reflective material. The body 10. The body 10 may include at least one of a resin material, such as PPA (Polyphthalamide), silicon (Si), a metallic material, PSG (photosensitive glass), sapphire ($Al_2O_3$), and a printed circuit board (PCB). For example, the body 10 may be formed of a resin material such as PPA, epoxy or Si.

In addition, the body 10 may include a conductor having conductivity. If the body 10 includes a material having electrical conductivity, an insulating layer (not shown) may be further formed on the surface of the body 10. The insulating layer can prevent the body 10 from being shorted with respect to the first and second lead frames 21 and 31 and the connection frame 46.

In addition, the body 10 may include a ceramic material, and the ceramic material may improve heat radiation efficiency.

When viewed from the top, the body 10 may have various shapes such as a triangular shape, a rectangular shape, a polygonal shape, a circular shape, and a shape having a curved surface. The first and second lead frames 21 and 31 may be mounted on a substrate in a direct type which the first and second lead frames 21 and 31 are disposed on the bottom surface of the body 10, or may be mounted on the substrate in an edge type in which the first and second lead frames 21 and 31 are disposed at the lateral side of the body 10. However, the embodiment is not limited thereto.

The body 10 includes the concave part 60 having an open upper portion. The concave part 60 includes a bottom 16 and lateral sides disposed at the peripheral portion of the bottom 16. When viewed from the top, the concave part 60 may have a cup structure, a cavity structure, or a recess structure recessed from the top surface of the body 10. When viewed from the top, the concave part 60 may have a circular shape, an oval shape, a polygonal shape (e.g., rectangular shape), and a polygonal shape having curved corners. However, the embodiments are not limited thereto. The lateral sides of the concave part 60 may be perpendicular to the bottom 16 or may be inclined with respect to the bottom 16, but the embodiment is not limited thereto.

The first lead frame 21 is disposed at a lower portion of a first region of the concave part 60, and a portion of the first lead frame 21 is exposed to the bottom 16 of the concave part 60. The first lead frame 21 is disposed therein with a first cavity 25 which is concave at a depth lower than that of the bottom 16 of the concave part 60. The cavity 25 is concave toward the bottom surface of the body 10 from the bottom 16 of the concave part 60. For example, the first cavity has a cup structure or a recess shape.

The lateral sides and the bottom surface of the first cavity 25 are formed by the first lead frame 21. The lateral sides of the first cavity 25 may be curved while being inclined with respect to the bottom surface of the first cavity 25 or perpendicular to the bottom surface of the first cavity 25. The two opposite lateral sides of the first cavity 25 may be inclined at the same angle or different angles.

The second lead frame 31 is disposed at the lower portion of the second region spaced apart from the first region of the concave part 60, and a portion 32 of the second lead frame is exposed to the bottom 16 of the concave part 60. The second lead frame 31 is disposed therein with a second cavity 35 which is concave at a depth lower than that of the bottom 16 of the concave part 60. The second cavity 35 is concave toward the bottom surface of the body 10 from the top surface of the second lead frame 31. For example, the second cavity 35 has a cup structure or a recess shape. The lateral sides and the bottom surface of the second cavity 35 are formed by the second lead frame 21. The lateral sides of the second cavity 35 may be curved while being inclined with respect to the bottom surface of the second cavity 35 or perpendicular to the bottom surface of the second cavity 25. The two opposite lateral sides of the second cavity 25 may be inclined at the same angle or different angles.

When viewed from the top, the first and second cavities 25 and 25 may have the same shape, but the embodiment is not limited thereto.

The bottom surfaces of the first and second lead frames 21 and 31 are exposed to the bottom surface of the body 10. The bottom surfaces of the first and second lead frames 21 and 31 may be disposed on the same surface as the bottom surface of the body 10 or disposed on the surface different from the bottom surface of the body 10.

As shown in FIG. 2, the first lead frame 21 includes a first lead part 23, and the first lead part 23 is disposed at the lower portion of the body 10 while protruding a first lateral side of the body 10. The second lead frame 31 includes a second lead part 33. The second lead part 33 is disposed at the lower portion of the body 10 while protruding a second lateral side opposite to the first lateral side of the body 10.

The bottom surfaces of the first and second cavities 25 and 35 may have a rectangular shape, a square shape, or a circular shape or an oval shape having curved surfaces.

The connection frame 46 is disposed on the bottom 16 of the concave part 60. The connection frame 46 may be interposed between the first and second lead frames 21 and 31, or may be disposed in a region spaced apart from the first and second lead frames 21 and 31 by equal intervals. The connection frame 46 serves as an intermediate connection terminal. The connection frame 46 may be removed.

The first lead frame 21, the second lead frame 31, and the connection frame 46 may include a metallic material. For example, the first lead frame 21, the second lead frame 31, and the connection frame 46 may include at least one of titanium (Ti), copper (Cu), nickel (Ni), gold (Au), chrome (Cr), tantalum (Ta), platinum (Pt), tin (Sn), silver (Ag), and phosphor (P). In addition, the first lead frame 21, the second lead frame 31, and the connection frame 46 may include a single metallic layer or a multi-layer metallic layer. The first and second lead frames 21 and 31 and the connection frame 46 may be formed at the same thickness, but the embodiment is not limited thereto.

The first light emitting chip 71 is disposed in the first cavity 25 of the first lead frame 21, and the second light emitting chip 72 is disposed in the second cavity 35 of the second lead frame 31.

The first and second light emitting chips 71 and 72 may selectively emit lights ranging from a visible light band to a UV (Ultraviolet) light band. For example, the first and second light emitting chips 71 and 72 may selectively include a red LED chip, a blue LED chip, a green LED chip, a yellow green LED chip. The first and second light emitting chips 71 and 72 include light emitting devices including the compound semiconductors of the group III-V elements.

The first light emitting chip 71 is connected to the first lead frame 21 disposed on the bottom 16 of the concave part 60 through the first wire 73, and connected to the connection frame 46 through the second wire 74. The second light emitting chip 72 is connected to the connection frame 46 through the third wire 75, and connected to the second lead frame 31 disposed on the bottom 16 of the concave part 60 through the fourth wire 76. The connection frame 46 electrically connects the first light emitting chip 71 to the second light emitting chip 72.

A protective device (not shown) may be disposed on a portion of the first lead frame 21 or the second lead frame 31. The protective device may include a thyristor, a Zener diode, or a TVS (transient voltage suppression). The Zener diode protects the light emitting chip from an electro static discharge (ESD). The protective device is connected to the connection circuit of the first and second light emitting chips 71 and 72 in parallel, thereby protecting the light emitting chips 71 and 72.

The molding member 81 may be formed in the concave part 60, the first cavity 25, and the second cavity 35. The molding member 81 may include a transmissive resin layer including silicon or epoxy, and may include a single layer or a multi-layer.

The molding member 81 may include a phosphor to convert the wavelength of light upward emitted from the light emitting chips 71 and 72. The phosphor may be contained in at least one of the first and second cavities 25 and 35, but the embodiment is not limited thereto. The phosphor excites a portion of light emitted from the light emitting chips 71 and 72 so that light having a different wavelength can be emitted. The phosphor may selectively include one of YAG, TAG, Silicate, Nitride, and Oxy-nitride. The phosphor may include at least one of red, yellow, and green phosphors, but the embodiment is not limited thereto. The molding member 81 may have a flat surface, a concave surface, or a convex surface, but the embodiment is not limited thereto.

The top surface of the molding member 81 may be a light exit surface. The optical control unit 80 is disposed on the top surface of the molding member 81. The area (or width) of the optical control unit 90 may be equal to or less than the area (or width) of the top surface of the body 10, but the embodiment is not limited thereto.

The optical control unit 90 is disposed closely to the light emitting device 1 or adheres to the light emitting device 1, so that the orientation angle distribution of the light emitted from the light emitting device 1 and the light emission distribution can be effectively adjusted. In addition, the optical control unit 90 may be adhered to the light emitting device 1 to control the orientation angle distribution, the light emission distribution, and the light intensity of the light emitted from the light emitting device 1.

The optical control unit 90 may be disposed at the distance of 4 mm or less from the bottom surface of the light emitting device 1. The distance is determined based on the orientation angle distribution and the light emission distribution of the light emitted from the light emitting device 1. In addition, the optical control unit 90 receives the light emitted from the light emitting device 1 with the distance of 2 mm or less from the light emitting device 1. The components of the optical control unit 90 may be spaced apart from the light emitting chips 71 and 72 by the distance of 4 mm or less.

The light emitting device 1 and the optical control unit 90 may include coupling members in structures thereof. The structural coupling members may include grooves or protrusion structures formed in the light emitting device 1 or the optical control unit 90, but the embodiment is not limited thereto.

As shown in FIG. 2, the optical control unit 90 may make contact with to the top surface of the body 10 and the top surface of the molding member 81, or may adhere to the top surfaces of the body 10 and the molding member 81 by using an adhesive agent. The optical control unit 90 may operate together with the light emitting device 1. For example, if the light emitting device 1 is operated to emit light, the optical control unit 90 is turned on to adjust the orientation angle distribution of the light emitted from the light emitting device 1. If the light emitting device 1 can be turned off, the optical control unit 90 can be turned off.

Figure 3:
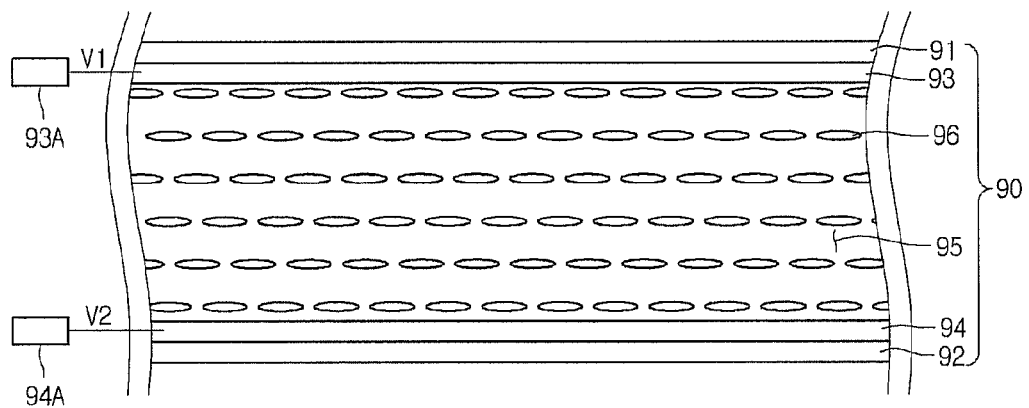
FIGS. 3 to 5 are views the operating states of an optical control unit according to the embodiment.

As shown in FIG. 3, the optical control unit 90 includes a first base film 91, a second base film 92, a first electrode layer 93, a second electrode layer 94, and a polymer layer 95.

The first and second base films 91 and 92 serve as transmissive films. The first and second base films 91 and 92 are disposed in parallel to each other while being spaced apart from each other by a predetermined distance. The first and second base films 91 and 92 are formed in an insulating material. The first electrode layer 93 includes a transmissive material, and is disposed between the first base film 91 and the polymer layer 95. The second electrode layer 94 includes a transmissive material, and is disposed between the second base film 92 and the polymer layer 95. The first and second electrode layers 93 and 94 face each other while interposing the polymer layer 95 therebetween. The first and second electrode layers 93 and 94 may be formed on the first and second base films 91 and 92, respectively, through the coating schemes.

A portion of the second base film 92 may make contact with the top surface of the molding member 81, and the first base film 91 may be disposed thereon with a protective film.

The first and second electrode layers 93 and 94 may include a transparent conductive polymer material such as metallic oxide or metallic nitride. For example, the first and second electrode layers 93 and 94 may include at least one of indium tin oxide (Indium Tin Oxide: ITO), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). In addition, the first and second electrode layers 93 and 94 may include transparent conductive polymer materials.

The first electrode layer 93 receives first driving voltage V1 generated by a first driving voltage generator 93A, and receives second driving voltage V2 generated by a second driving voltage generator 94A.

If the electric field is formed between the first and second electrode layers 93 and 94 by the first and second driving voltages V1 and V2, the optical control unit 90 is turned on to adjust the light orientation angle due to the potential difference between the first and second driving voltages V1 and V2. If the driving voltages V1 and V2 are not applied to the optical control unit 90, the optical control unit 90 is turned off.

The polymer layer 95 is interposed between the first and second electrode layers 93 and 94, and has a liquid crystal 96 distributed therein. The liquid crystal 96 distributed in the polymer layer 95 transmits or scatters incident light by the first and second driving voltages V1 and V2 of the optical control unit 90. The liquid crystal 96 may include positive and negative liquid crystals representing different dielectric constants between major and minor axes. The polymer layer 95 has the refractive index equal to an ordinary refractive index or an extra-ordinary refractive index of the liquid crystal 96.

The polymer layer 95 adjusts the orientation angle of the light emitted from the light emitting device 1 according to the difference between the first driving voltage supplied from the first electrode layer 93 and the second driving voltage supplied from the second electrode layer 94.

The width of the polymer layer 95 may be equal to or different from that of the light emitting device 1 or the body 10. In this case, the width of the polymer layer 95 may be in the range of 90% to 150% of the width of the light emitting device 1 or the body 10. In addition, the widths of the first and second electrode layers 93 and 94 may be in the range of 90% to 150% of the width of the light emitting device 1 or the body 10. The area of the bottom surface of the polymer layer 95 may be in the range of 90% to 150% of the area of the bottom surface of the light emitting device 1 or the body 10. The areas of the bottom surfaces of the first and second electrode layers 93 and 94 may be in the range of 90% to 150% of the area of the bottom surface of the body 10 or the light emitting device 1.

The polymer layer 95 having the liquid crystal 96 distributed therein may be formed through the following scheme. First, after mixing polymer with liquid crystal by using a solvent, the solvent is removed from the mixed solution to form the polymer layer 95 having the liquid crystal distributed therein. Alternatively, after mixing liquid crystal with liquid-phase polymer (or monomer), ultraviolet (UV) light is irradiated into the mixed solution to cure the polymer (or monomer), thereby forming the polymer layer 95. However, the scheme of forming the polymer layer 95 having the liquid crystal 96 distributed therein is not limited thereto. The thickness of the polymer layer 95 may be in the range of 3 μm to 50 μm, but the embodiment is not limited thereto. The polymer layer 95 may include the liquid crystal 96 having an isotropic property while representing the refractive index of 0.15 to 0.25. In addition, the light scattering of the liquid crystal 96 may be increased as the refractive-index anisotropy is increased. A sealing member may be disposed around the polymer layer 95 to prevent the liquid crystal 96 from being leaking, but the embodiment is not limited thereto.

The light source module 100 operates a first orientation angle mode or a second orientation angle mode by the optical control unit 90. Meanwhile, if the optical control unit 90 is turned off, the optical control unit 90 operates at a blocking mode to block incident light.

As described above, the optical control unit 90 is turned on or turned off to control the transmission or the blocking of the light. When the optical control unit 90 is turned on, the optical control unit 90 controls the output of the light at the first orientation angle mode or the second orientation angle mode according to the difference between the first and second driving voltages V1 and V2 supplied to the optical control unit 90. The first orientation angle mode is a narrow orientation angle mode, and the second orientation angle mode is a wide orientation angle mode. In other words, the orientation angle mode may be switched into the narrow orientation angle mode or the wide orientation angle mode according to the difference between the first driving voltage V1 and the second driving voltage V2. At the first orientation angle mode, the light is output with the orientation angle distribution of 130° or less. At the second orientation angle mode, the light is output with the orientation angle distribution of 140° or more. In other words, the optical control unit 90 outputs light with the orientation angle difference of 10° or more according to the input driving voltages V1 and V2.

As shown in FIG. 3, if the first and second driving voltages V1 and V2 are not applied to the optical control unit 90, the liquid crystal 96 of the polymer layer 95 is aligned in a horizontal direction to block the incident light. In this case, the light source module 100 may be driven at a black mode.

Figure 4:
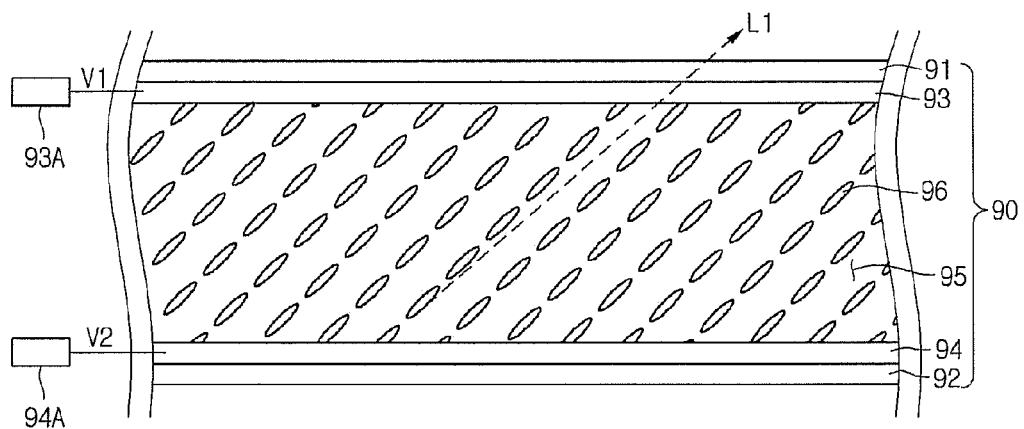
Figure 6:
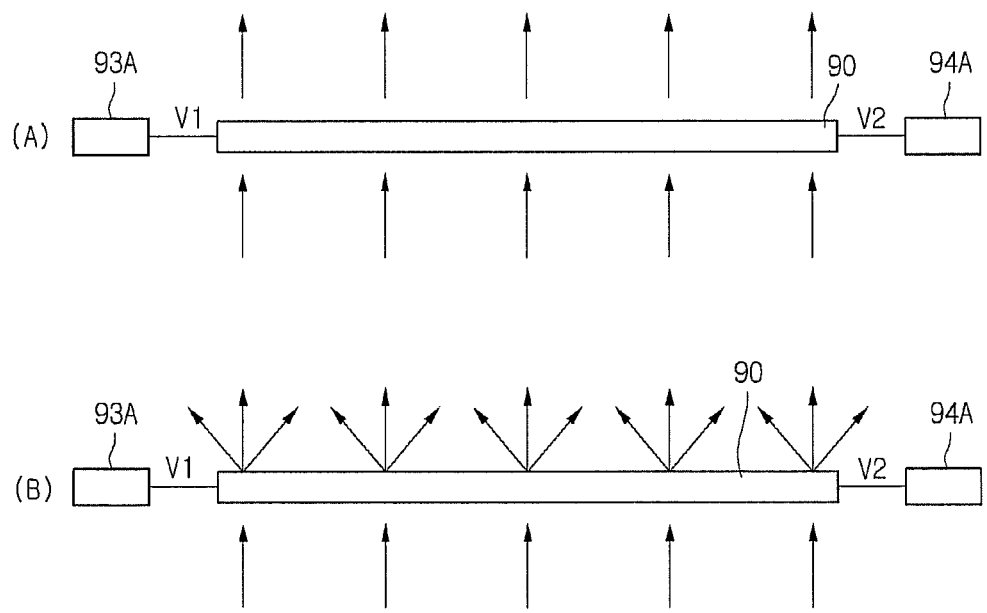
FIGS. 6(A) and 6(B) are views showing an example of light output of the optical control unit according to the embodiment.

As shown in FIG. 4, the first and second driving voltages V1 and V2 are applied to the optical control unit 90. The difference between the first and second driving voltages V1 and V2 may be the range of about 30% to about 70% of the first driving voltage V1. In this case, the liquid crystal 96 of the polymer layer 95 is aligned in an oblique direction or an inclination direction, for example, at an angle of 30° to 70°, so that the incident light is scattered. Accordingly, as shown in FIG. 6(B), the optical control unit 90 scatters the incident light so that the light is emitted with the distribution of the orientation angle of 140° or more. In other words, the light source module irradiates light L1 with the distribution of the orientation angle of 140° or more.

Figure 5:
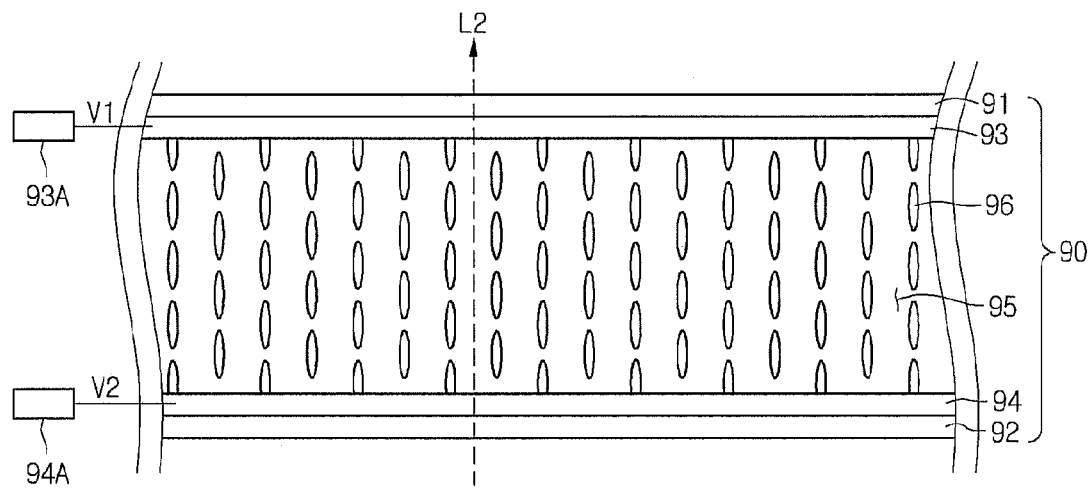

As shown in FIG. 5, if the first and second driving voltages V1 and V2 are applied to the optical control unit 90 and the difference between the first and second driving voltages V1 and V2 is maximized, the liquid crystal 96 of the polymer layer 95 is vertically aligned so that the light is transmitted. As shown in FIG. 6(A), since the optical control unit 90 of the light source module transmits incident light, light L2 is emitted with the orientation angle distribution of 130° or less. In other words, the light source module irradiates light L2 with the orientation angle distribution of 130°. If the difference between the first and second driving voltages V1 and V2 is maximized, the second driving voltage V2 makes a difference from the first driving voltage V1 by the range of 70% to 100% of the first driving voltage V1.

The optical control unit 90 according to the embodiment may selectively output light, which is not diffused from the light emitting device 1, according to the difference between the input voltages V1 and V2 at the narrow orientation angle mode or the wide orientation angle mode. The light source module having the optical control unit 90 is applicable to the high-specification lamp.

In addition, the optical control unit 90 may include a piezoelectric device. The piezoelectric device includes a piezoelectric element disposed on the body 10 and a conductive fluid on the molding member 81. The shape of the conductive fluid is changed to a convex-up shape or a concave shape according to the difference between voltages supplied to the piezoelectric element, so that the orientation angle of the light transmitted from the molding member 81 can be adjusted.

Figure 7:
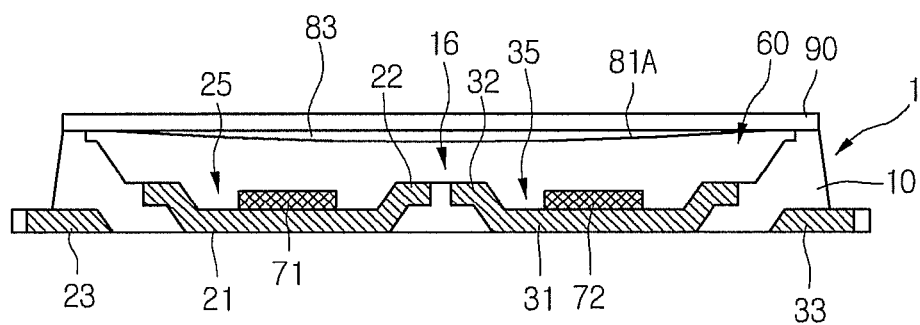
FIG. 7 is a view showing a first modification of the light source module of FIG. 2.

FIG. 7 is a sectional view showing a first modification of the light source module of FIG. 2. In the following description of FIG. 7, the elements the same as those of the first embodiment are described by making reference to the description of the first embodiment, and the details thereof will be omitted in order to avoid redundancy.

Referring to FIG. 7, the light emitting device includes a diffusing layer 83 formed between a molding member 81A disposed in the concave part 60 of the body 10 and the optical control unit 90. The top surface of the molding member 81A has the shape of a concave lens, and has a predetermined gap from the bottom surface of the optical control unit 90.

The molding member 81A may contain impurities such as phosphors, but the embodiment is not limited thereto.

The diffusing layer 83 may be an empty space or may include a resin layer having a light-diffusing agent. The diffusing layer 83 may diffuse the light emitted from the light emitting chips 71 and 72.

Since the diffusing layer 83 diffuses the light incident into the optical control unit 90, the chromaticity distribution of the light emitted by the optical control unit 90 can be enhanced.

Figure 8:
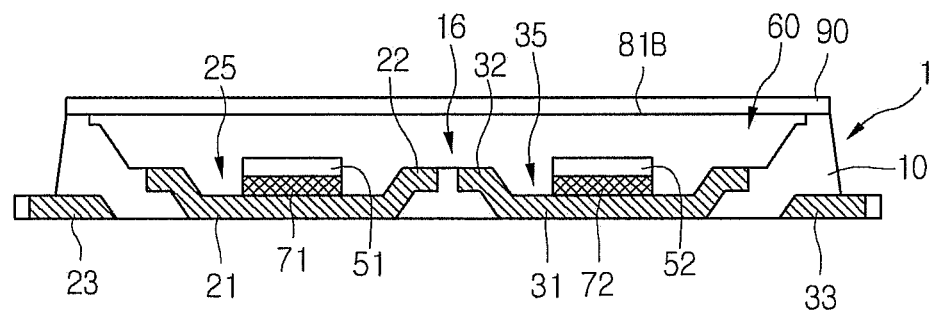
FIG. 8 is a sectional view showing a second modification of the light source module of FIG. 2.

FIG. 8 is a sectional view showing the first modification of the light source module of FIG. 2. In the following description of FIG. 8, the elements the same as those of the first embodiment are described by making reference to the description of the first embodiment, and the details thereof will be omitted in order to avoid redundancy.

Referring to FIG. 8, in the light emitting device, first and second phosphor layers 51 and 52 are attached to the top surface of the first and second light emitting chips 71 and 72. The bottom surfaces of the first and second phosphor layers 51 and 52 may have an area equal to or smaller than that of the top surfaces of the first and second light emitting chips 71 and 72. The phosphor layers 51 and 52 may more extend beyond the lateral sides of the first and second light emitting chips 71 and 72, but the embodiment is not limited thereto.

The first and second phosphor layers 51 and 52 may include at least one of red, blue, yellow, and green phosphors. The first and second phosphor layers 51 and 52 may include the same phosphor or different phosphors.

The first and second phosphor layers 51 and 52 may be formed at the thickness of 1 μm to 100 μm from the first and second light emitting chips 71 and 72, but the embodiment is not limited thereto.

Therefore, a molding member 81B disposed in the concave part 60 of the body 10 may not contain a phosphor, or may contain a phosphor different from those of the first and second phosphor layers 51 and 52. However, the embodiment is not limited thereto. The molding member 81B may be not formed in the concave part 60.

Figure 9:
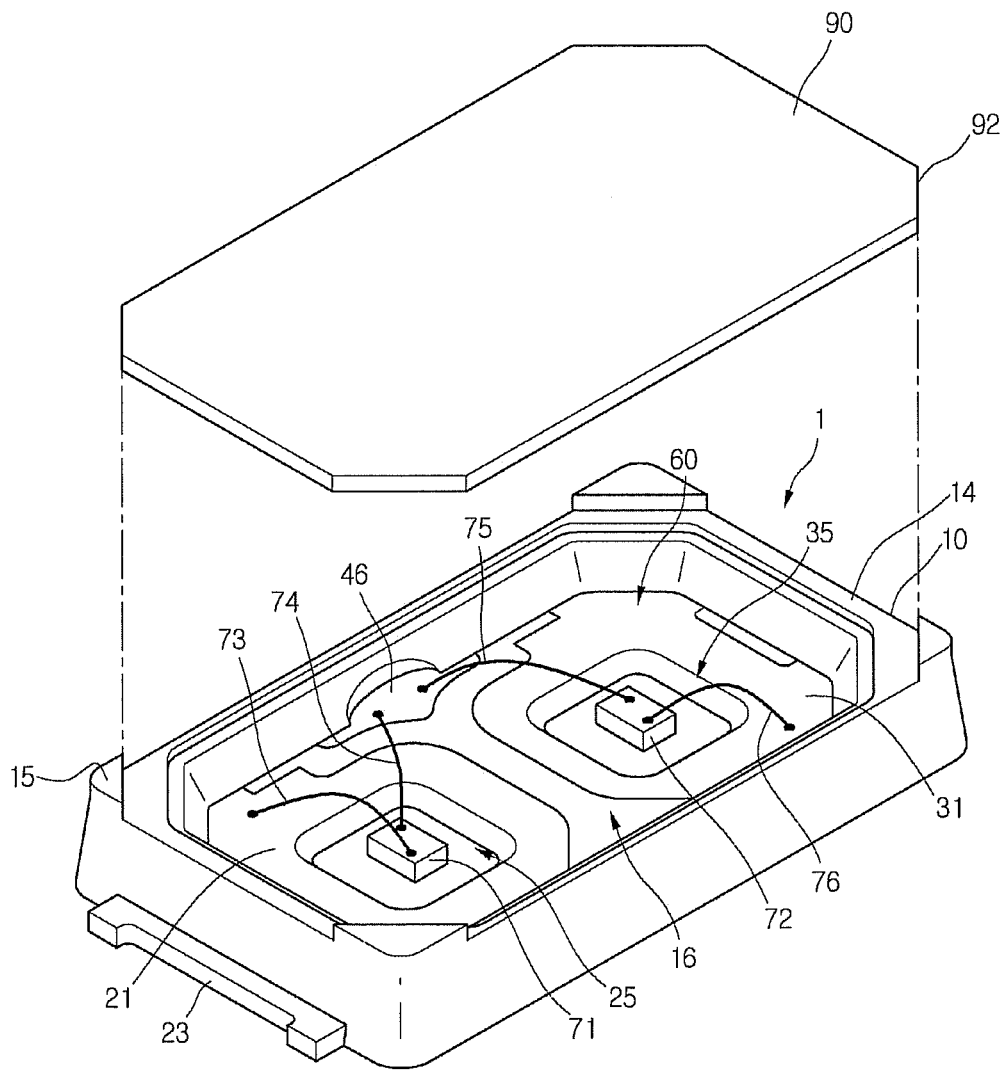
FIG. 9 is an exploded perspective view showing a light source module according to the second embodiment.
Figure 10:
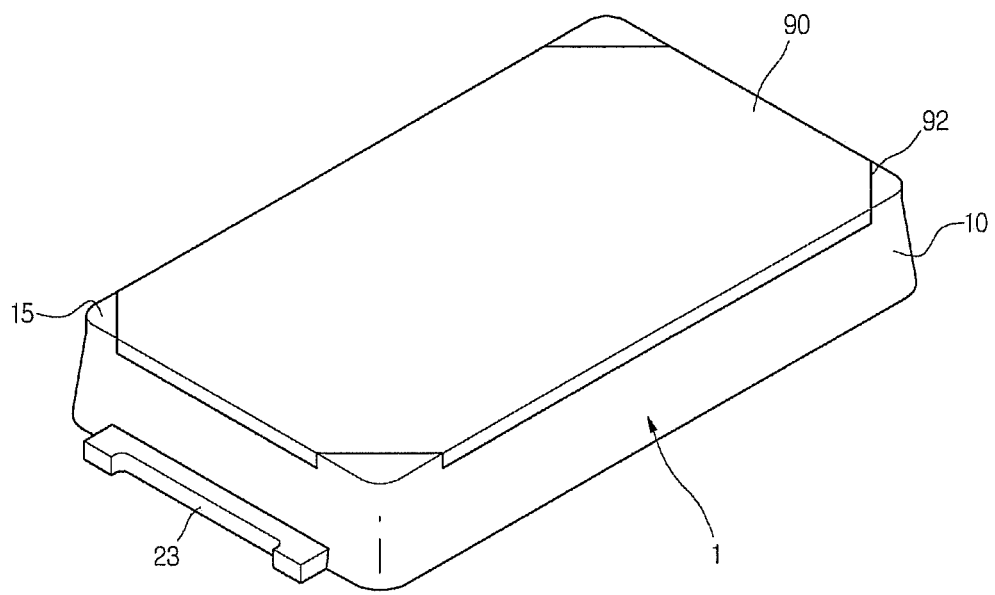
FIG. 10 is a perspective view showing the assembling of the light source module of FIG. 7.

FIG. 9 is an exploded perspective view showing a light source module according to the second embodiment. FIG. 10 is a perspective view showing the assembling of the light source module. In the following description of the second embodiment, the elements the same as those of the first embodiment are described by making reference to the description of the first embodiment, and the details thereof will be omitted in order to avoid redundancy.

Referring to FIGS. 9 and 10, the light emitting device includes a plurality of guide parts 15 formed around the top surface 14 of the body 10. The guide parts 15 protrude from the body 10, or may include a material the same as that of the body 10 or a material different from that of the body 10.

The guide parts 15 protrude at a corner of the upper portion of the body 10 to support the peripheral portion of the optical control unit 90. The optical control unit 90 includes a coupling part 92 corresponding to each guide part 15. The coupling part 92 includes a cutting surface of the corner of the optical control unit 90.

If the optical control unit 90 is stacked on the body 10, the guide part 15 guides and supports the coupling part 92 of the optical control unit 90. Accordingly, the tilting of the optical control unit 90 can be prevented by the guide part 15, and the assembling or the dissembling of the optical control unit 90 is easy.

The guide part 15 may have a thickness the same as that of the optical control unit 90, thinner than the thickness of the optical control unit 90, or thicker than the thickness of the optical control unit 90.

Figure 11:
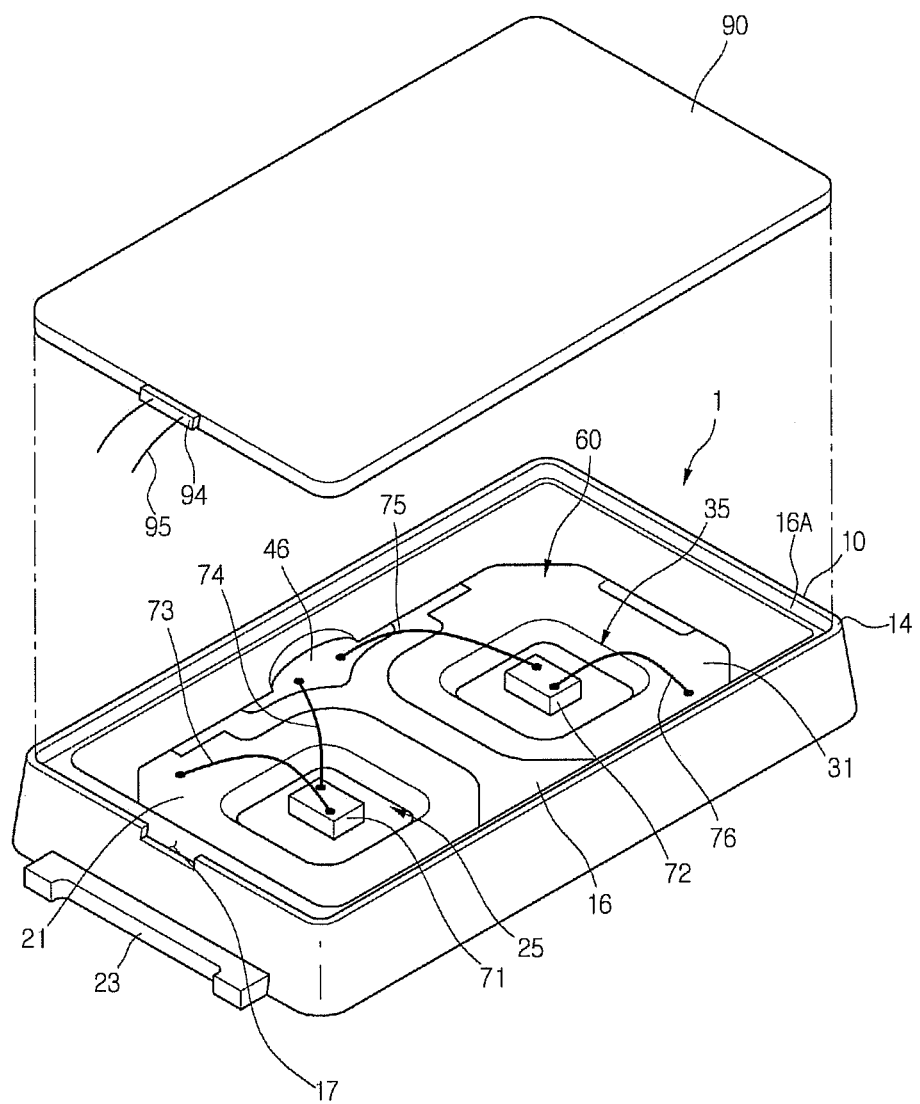
FIG. 11 is an exploded perspective view showing a light source module according to the third embodiment.
Figure 12:
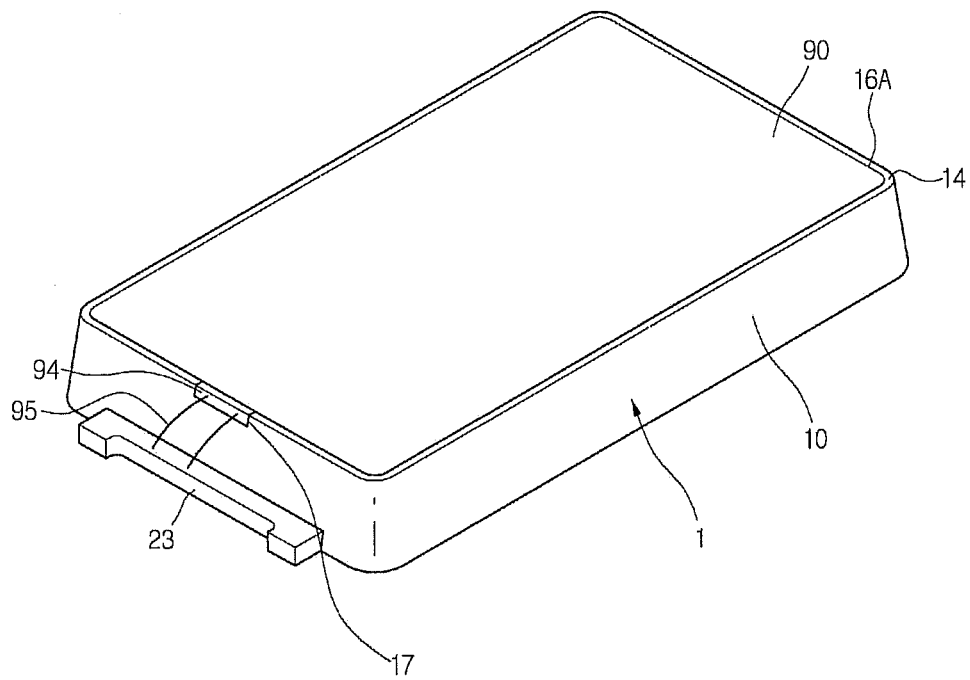
FIG. 12 is a perspective view showing the assembling of the light source module of FIG. 1.

FIG. 11 is an exploded perspective view showing a light source module according to the third embodiment. FIG. 12 is an assembling perspective view of the light source module of FIG. 11. In the following description of the third embodiment, the elements the same as those of the first embodiment are described by making reference to the description of the first embodiment, and the details thereof will be omitted in order to avoid redundancy.

Referring to FIGS. 11 and 12, the light emitting device is disposed at an upper portion thereof with a receiving groove 16A. The receiving groove 16A is disposed around the concave part 60 of the body 10, and stepped from the top surface of the body 10 at a height lower than that of the top surface of the body 10.

A connector groove 17 is formed at a portion of the receiving groove 16A. The connector groove 17 may be formed by opening one lateral side of the body 10.

The optical control unit 90 is received in the receiving groove 16A, and a connector 94 connected to the optical control unit 90 may be coupled with the connector groove 17. The connector 94 may be connected to a plurality of wires 95 introduced from the outside.

Figure 13:
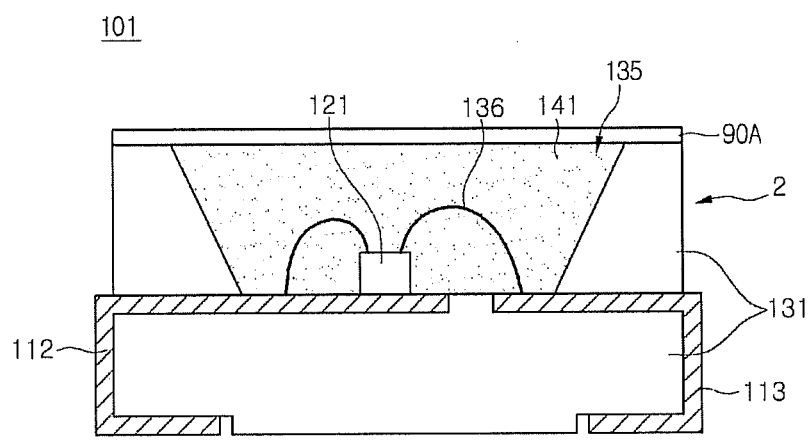
FIG. 13 is a side sectional view showing a light source module according to the fourth embodiment.

FIG. 13 is a view showing a light source module 101 according to the fourth embodiment.

Referring to FIG. 13, the light source module 101 includes a light emitting device 2 and an optical control unit 90A disposed on the light emitting device 2.

The light emitting device 2 includes a body 131, first and second lead frames 112 and 113 installed in the body 131, a molding member 141, and a light emitting chip 121.

The body 131 may be formed through the injection molding scheme using the high reflectance resin (e.g., PPA), polymer, or plastic, or may be formed in the stack structure of a single layer substrate, or a multi-layer substrate. The body 131 may be formed by adding a reflective material into a resin material such as epoxy or silicon, but the embodiment is not limited thereto. The body 131 is disposed therein with a cavity 135. The peripheral surface of the cavity 135 may be inclined or may be perpendicular to the bottom surface of the cavity 135.

The first and second lead frames 112 and 113 are disposed on the bottom surface of the cavity 135 while being spaced apart from each other.

A light emitting chip 121 is disposed on at least one of the first and second lead frames 112 and 113, and connected to the first and second lead frames 112 and 113 through a wire 136.

A molding member 141 is formed in the cavity 125. The molding member 141 may include a transmissive resin material such as silicon or epoxy, and may include a phosphor.

If power is supplied to the light emitting chip 121 through the first and second lead frames 112 and 113, most of light may be extracted through the top surface and the lateral side of the light emitting chip 121. The extracted light may be emitted to the outside through the molding member 141. In this case, the optical control unit 90A is disposed on both of the body 131 of the light emitting device 2 and the molding member 141 to adjust the orientation angle of light passing through the molding member 141. The description of the structure of the optical control unit 90A is made by making reference to the optical control unit according to the first embodiment, and the details thereof will be omitted.

The light source module according to the embodiment is applicable to a lighting system. The lighting system may include a structure in which a plurality of light source modules are arrayed. The lighting system may include a lighting lamp, a signal lamp, a headlamp for a vehicle, and an electronic display.

Figure 14:
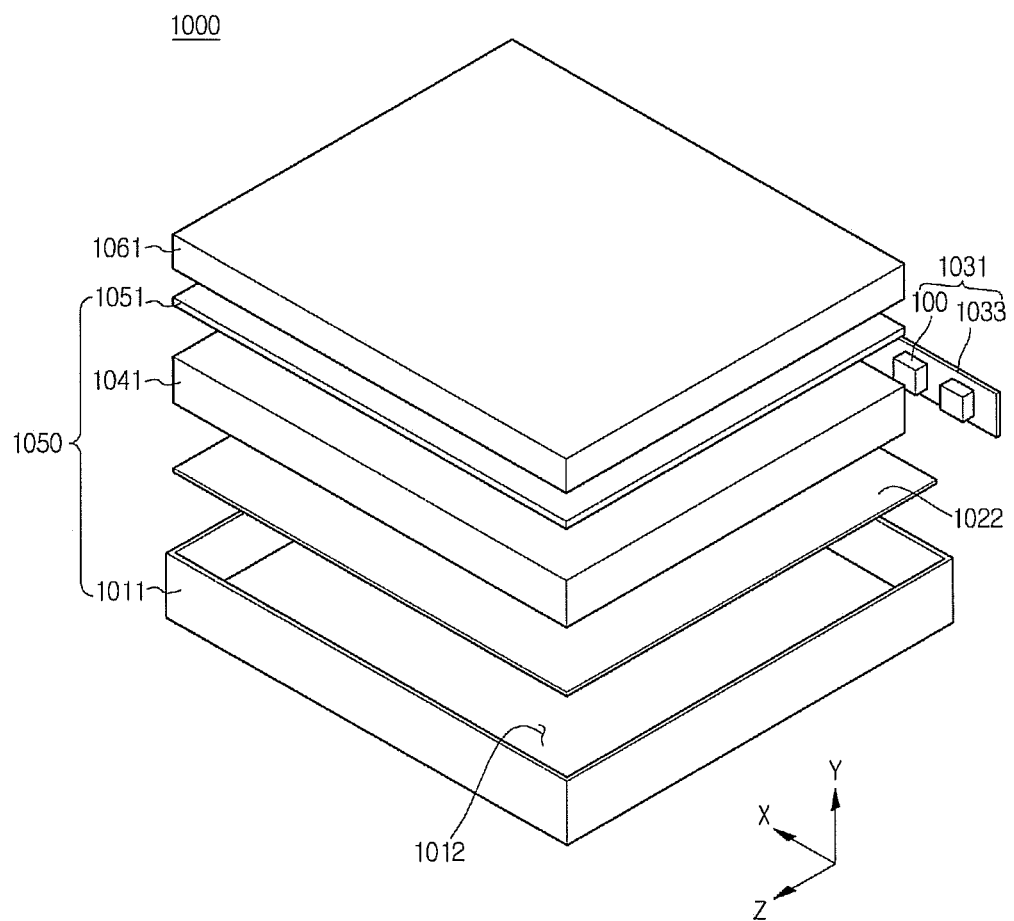
FIG. 14 is a perspective view showing a display apparatus having a light source module according to the embodiment.
Figure 15:
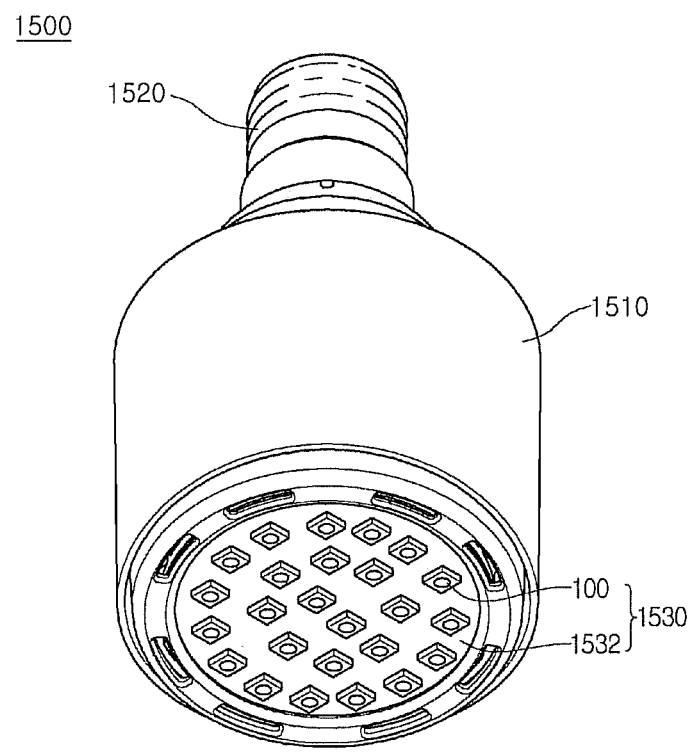
FIG. 15 is a perspective view showing a display apparatus having a light source module according to the embodiment.

FIG. 14 is a perspective view showing a display device having the light source module of FIG. 1, and FIG. 15 is a view showing a lighting apparatus having the light source module of FIG. 1.

FIG. 14 is an exploded perspective view showing a display apparatus having the light emitting device according to the embodiment.

Referring to FIG. 14, a display apparatus 1000 includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the light emitting module 1031, the reflective sheet 1022, the light guide plate 1041, and the optical sheet 1051 may be defined as a light unit 1050.

The light guide plate 1041 diffuses the light supplied from the light emitting module 1031 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is disposed in the bottom cover 1011 to directly or indirectly supply the light from one side of the light guide plate 1041. The light emitting module 1031 may include a substrate 1033 and a plurality of light source modules 100, which are disclosed above, and the light source modules 100 are arranged on the substrate 1033 while being spaced apart from each other at the predetermined interval. The substrate 1033 includes a circuit pattern having an electrode pad on at least one of top and bottom surfaces thereof. The substrate 1033 may also include a metal core PCB (MCPCB) or a flexible PCB (FPCB) as well as a PCB including resin, but the embodiment is not limited thereto. If the light source module 100 is mounted on the lateral side or the heat radiation plate of the bottom cover 1011, the substrate 1033 may be removed. A portion of the heat radiation plate may make contact with the top surface of the bottom cover 1011. Therefore, the heat emitted from the light source module 100 may be emitted to the bottom cover 1011 through the heat radiation plate.

The light source module 100 may be mounted on the substrate 1033 in such a manner that the light exit surface to emit light is spaced apart from the light guide plate 1041 by a predetermined distance, but the embodiment is not limited thereto. The light source module 100 may directly or indirectly provide light to the light incident part which is one lateral side of the light guide plate 1041, but the embodiment is not limited thereto.

The light emitted from the light source 100 may be incident into the light guide plate 1041. A light module disposed corresponding to the outermost portion of the light guide plate 1041 allows the optical control unit 90 to operate at the narrow orientation angle mode as shown in FIG. 5, thereby preventing light leakage failure. Light source modules disposed corresponding to regions except for the outermost portion of the light guide plate 1041 allow the optical control unit 90 to operate at the wide orientation angle module as shown in FIG. 4. In other words, according to the embodiment, the difference between the driving voltages of the optical control unit 90 of different light sources 100 disposed at the light incident part of the light guide plate 1041 is adjusted, so that the light can be output with different orientation angle distribution.

The light guide plate 1041 converts the light incident therein from the light source module 100 to surface light to be output.

The reflective member 1022 may be disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 includes a receiving part 1012. The receiving part 1012 has at least an opened upper portion, and may receive the light guide plate 1041, the light source module 1031, and the reflective member 1022 therein. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough or blocking the light. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

FIG. 15 is a perspective view showing a lighting device according to the embodiment.

Referring to FIG. 15, a lighting device 1500 includes a case 1510, a light emitting module 1530 installed in the case 1510, and a connector 1520 installed in the case 1510 to receive power from an external power source.

Preferably, the case 1510 includes a material having superior heat radiation property. For example, the case 1510 includes a metallic material or a resin material.

The light emitting module 1530 may include a substrate 1532 and light source modules 100 according to the embodiment installed on the substrate 1532. The light source modules 100 are spaced apart from each other or arranged in the form of a matrix. For example, the light source module 100 disposed at the outermost part of the substrate 1532 may be operated at the narrow orientation angle mode by the optical control unit 90 as shown in FIG. 5, and the light source module 100 disposed at the center region of the substrate 1532 may be operated at the wide orientation angle mode by the optical control unit 90 as shown in FIG. 4. In addition, the light source modules 100 may be operated at the same mode (narrow orientation angle mode or wide orientation angle mode) by the optical control unit 90.

The substrate 1532 includes an insulating member printed with a circuit pattern. For example, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light source module 100 is installed on the substrate 1532. The light source module 100 may include at least one LED (light emitting diode) chip. The LED chip may include an LED that emits the light of visible ray band having red, green, blue or white color and a UV (ultraviolet) LED that emits UV light.

The light emitting modules 1530 may include the various combinations of the light source modules 100 to provide various colors and brightness. For example, the white LED, the red LED and the green LED can be combined to achieve the high color rendering index (CRI).

The connector 1520 is electrically connected to the light emitting module 1530 to supply power to the light emitting module 1530. The connection terminal 1520 has a shape of a socket screw-coupled with the external power source, but the embodiment is not limited thereto. For example, the connector 1520 can be prepared in the form of a pin inserted into the external power source or connected to the external power source through a wire.

Figure 16:
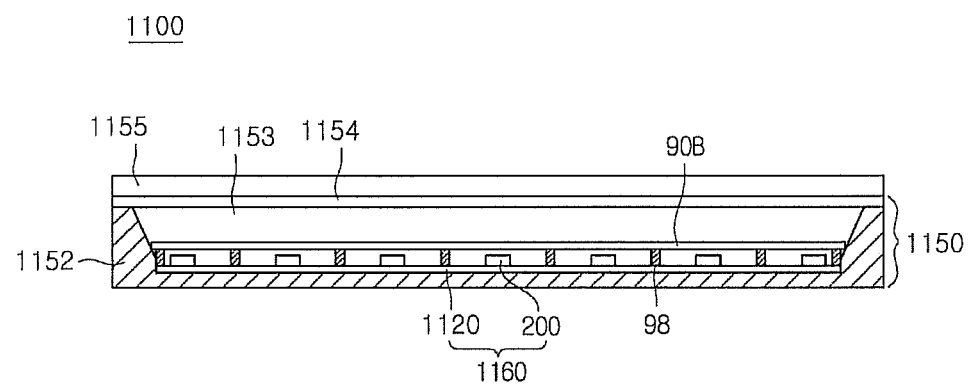
FIG. 16 is a side sectional view showing a display apparatus having an optical control unit according to the fourth embodiment.

FIG. 16 is a sectional view showing a display device 1100 according to the embodiment.

Referring to FIG. 16, the display device 1100 includes a bottom cover 1152, a substrate 1120 on which above-disclosed light emitting devices 200 are arrayed, an optical control unit 90B on the substrate 1120, an optical sheet 1154, and a display panel 1155.

The light emitting device 200 may be a light emitting device in which the light emitting chip is packaged as shown in FIG. 2 or FIG. 9, or may be realized in the form of a light emitting chip, but the embodiment is not limited thereto.

The substrate 1120 and the light emitting devices 200 may constitute a light emitting module 1160. In addition, the bottom cover 1152, the optical control unit 90B, at least one light emitting module 1160, and the optical member 1154 may constitute a light unit 1150. A plurality of light emitting devices 200 may be arranged in at least one row or at least two rows on the substrate 1120.

A plurality of supporters 90 are interposed between the optical control unit 90B and the substrate 1120. The supporters 90 are disposed on the substrate 1120 to support the lower portion of the optical control unit 90B and reflect the light emitted from the light emitting device 200. The optical control unit 90B has the structure shown in FIG. 3. The optical control unit 90B operates at the narrow orientation angle mode or the wide orientation angle mode according to the difference between supplied driving voltages. When the optical control unit 90B operates at the wide orientation angle mode, the incident light is output as the surface light. Accordingly, the pitch between the light emitting devices 200 is increased, so that the total number of the light emitting devices 200 can be reduced. In addition, the distance between the optical control unit 90B and the optical sheet 1154 can be reduced, so that the display device 1100 can be disposed in a slim structure.

The bottom cover 1152 can be disposed therein with a receiving part 1153, and a plurality of light emitting modules 1160 may be arranged on the bottom surface of the receiving part 1153, but the embodiment is not limited thereto.

The optical sheet 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display panel 1150, and the brightness enhanced sheet improves the brightness by reusing the light to be lost.

The optical sheet 1154 is disposed above the light emitting module 1060 in order to convert the light emitted from the light emitting module 1060 into the surface light. In addition, the optical member 1154 may diffuse or collect the light.

According to the embodiment, a light source module having a unit to adjust the orientation angle of the light emitted from the light emitting device can be disposed at the upper portion of the light emitting device. According to the embodiment, the light orientation angle of the light emitting device can be adjusted, and the high-specification lamp can be disposed.

According to the embodiment, the reliability of the light source module having the optical control unit and the light unit having the light source module can be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A light source module comprising:
   a body having a cavity;
   a plurality of lead frames in the cavity;
   a light emitting chip disposed on at least one of the lead frames;
   a polymer layer disposed on the body to refract light emitted from the light emitting chip;
   a first electrode layer disposed on the polymer layer to emit incident light; and a second electrode layer interposed between the polymer layer and the body to transmit the light emitted from the light emitting chip.

2. The light source module of claim 1, wherein the polymer layer changes an orientation angle of light incident from the first electrode layer according to a difference between voltages supplied to the first and second electrode layers.

3. The light source module of claim 1, wherein the polymer layer includes liquid crystal.

4. The light source module of claim 3, wherein the liquid crystal includes a refractive-index anisotropy.

5. The light source module of claim 4, wherein the polymer layer has a refractive index in a range of 0.15 to 0.25.

6. The light source module of claim 3, further comprising a first base film on the first electrode layer and a second base film under the second electrode layer.

7. The light source module of claim 6, wherein the first and second base films include transmissive films.

8. The light source module of claim 1, wherein the first and second electrode layers include transmissive metallic oxide or transmissive metallic nitride.

9. The light source module of claim 1, further comprising a molding member in the cavity.

10. The light source module of claim 1, wherein the polymer layer has a thickness in a range of 3 μm to 50 μm, and the first electrode layer has an interval of 4 mm or less from the light emitting chip.

11. A light source module comprising:
a body having a cavity;
a plurality of lead frames in the cavity;
a light emitting chip disposed on at least one of the lead frames;
a molding member in the cavity;
a polymer layer disposed on the molding member to refract light emitted from the light emitting chip;
a first electrode layer disposed on the polymer layer to emit incident light; and
a second electrode layer interposed between the polymer layer and the body to transmit the light emitted from the light emitting chip,
wherein the polymer layer changes an orientation angle of the light emitted from the light emitting chip according to a difference between first and second driving voltages supplied to the first and second electrode layers.

12. The light source module of claim 11, further comprising a sealing member disposed around the polymer layer.

13. The light source module of claim 11, further comprising a first base film disposed on the first electrode layer and a second base film disposed under the second electrode layer while making contact with the molding member.

14. The light source module of claim 11, wherein the polymer layer includes liquid crystal.

15. The light source module of claim 11, wherein the polymer layer blocks or transmits the light emitted from the light emitting chip according to voltages of the first and second electrode layers.

16. The light source module of claim 11, wherein the first and second electrode layers have widths wider than a width of the body.

17. A lighting apparatus comprising:
a plurality of light emitting devices including a body having a cavity, a plurality of lead frames in the cavity, and a light emitting chip disposed on at least one of the lead frames;
a plurality of control units disposed on the light emitting devices, respectively, to adjust an orientation angle of light emitted from a molding member according to an optical characteristic converted by a difference between supplied voltages; and
a light guide plate on the control units,
wherein each control unit includes a polymer layer disposed on the body and having liquid crystal, a first electrode layer disposed on the polymer layer and emitting incident light, and a second electrode layer interposed between the polymer layer and the body to transmit the light emitted from the light emitting chip.

18. The lighting apparatus of claim 17, wherein the control unit irradiates the incident light with distribution of a light orientation angle of 130° or less if a difference between first and second driving voltages supplied to the first and second electrode layers exceeds 70% of the first driving voltage.

19. The lighting apparatus of claim 17, wherein the control unit irradiates the incident light with distribution of a light orientation angle of 140° or more if a difference between first and second driving voltages supplied to the first and second electrode layers in a range of 30% to 70% of the first driving voltage.

20. The lighting apparatus of claim 17, further comprising a receiving groove formed around a top surface of the body of each light emitting device such that the control unit is coupled with the receiving groove.

* * * * *